United States Patent
Park et al.

[11] Patent Number: 5,936,296
[45] Date of Patent: Aug. 10, 1999

[54] INTEGRATED CIRCUITS HAVING METALLIC FUSE LINKS

[75] Inventors: Yong Park; Soo-Cheol Lee, both of Seoul, Rep. of Korea

[73] Assignee: Samsung Electronics Co., Ltd., Rep. of Korea

[21] Appl. No.: 09/097,904

[22] Filed: Jun. 16, 1998

[30] Foreign Application Priority Data

Jun. 23, 1997 [KR] Rep. of Korea ............. 97-26418

[51] Int. Cl.[6] .................................................. H01L 29/00
[52] U.S. Cl. ................................................................ 257/529
[58] Field of Search .................................................. 257/529

[56] References Cited

U.S. PATENT DOCUMENTS

| | | | |
|---|---|---|---|
| 4,536,949 | 8/1985 | Takayama et al. | 29/578 |
| 4,794,568 | 12/1988 | Lim et al. | 365/200 |
| 4,829,480 | 5/1989 | Seo | 365/200 |
| 5,025,300 | 6/1991 | Billig et al. | 357/51 |
| 5,070,392 | 12/1991 | Coffey et al. | 438/601 |
| 5,185,291 | 2/1993 | Fischer et al. | 437/173 |
| 5,241,212 | 8/1993 | Motonami et al. | 257/529 |
| 5,244,836 | 9/1993 | Lim | 437/192 |
| 5,297,085 | 3/1994 | Choi et al. | 365/200 |
| 5,374,590 | 12/1994 | Batdorf et al. | 437/173 |
| 5,578,517 | 11/1996 | Yoo et al. | 437/60 |
| 5,672,905 | 9/1997 | Lee et al. | 257/529 |
| 5,813,881 | 9/1998 | Nathan et al. | 257/529 |

*Primary Examiner*—Tom Thomas
*Assistant Examiner*—Ori Nadav
*Attorney, Agent, or Firm*—Myers Bigel Sibley & Sajovec

[57] ABSTRACT

An integrated circuit includes a metallic fuse link blown by a laser beam which may enhance the long term reliability of the metallic fuse link. The integrated circuit includes an insulating layer formed on a semiconductor substrate. First and second metal wiring layers each with an end surface and an upper surface are located on the insulating layer. The first and second metal wiring layers are arranged so that the end surface of each metal wiring layer faces the other metal wiring layer. A metallic fuse layer is located on the upper surfaces of the metal wiring layers, on the end surfaces of the metal wiring layers and therebetween to define a metallic fuse link.

12 Claims, 9 Drawing Sheets

INTEGRATED CIRCUITS HAVING METALLIC FUSE LINKS

FIELD OF THE INVENTION

The present invention relates to integrated circuits and methods of forming integrated circuits, and more particularly to integrated circuits having metallic fuse links and methods for forming the same.

BACKGROUND OF THE INVENTION

Semiconductor integrated circuits may include fusible conductive links, (i.e., fuses), which may be removed by irradiation using laser light. For example, in semiconductor memories such as dynamic random access memories (DRAMs), static random access memories (SRAMs), electrically erasable and programmable read only memories (EEPROMs) and so on, defective memory cells can be replaced by blowing fuses associated with them and allowing spare memory cells to be selected instead of the defective memory cells. Such a replacement technique, (i.e., a redundancy technique) may be accomplished by blowing fuses to inactivate a row or column line, or a memory block of defective memory cells and to activate a row or column line, or a memory block of spare memory cells upon receipt of address signals designating the defective memory cells, to enhance the fabrication yield of semiconductor memories. These redundancy techniques are disclosed in U.S. Pat. Nos. 4,794,568, 4,829,480 and 5,297,085, all of which are assigned to the present assignee, the disclosures of which are hereby incorporated herein by reference.

Semiconductor memory chips (e.g., such as DRAMs) may embed electronic circuit devices for performing various modes of operation such as a static column mode, page mode, nibble mode and the like. If users require a particular mode of operation, fuses may be blown to inactivate the unwanted modes. Fuses may also be blown to select desired logic circuits in semiconductor integrated circuits.

Recent integrated circuits use multilevel metallization techniques including at least two or more stacked interlevel insulating layers and metal interconnection layers formed on each interlevel insulating layer so as to increase the integration density for a given chip area. The metal interconnection layers are interconnected with circuit devices on a semiconductor substrate or with other interconnection layers through metallic plugs filled in via holes therein. Conventionally, fuses are formed between a topmost interlevel insulating layer and an underlying interlevel insulating layer contiguous thereto. The topmost interlevel insulating layer which is commonly called a passivating layer may have grooves therein so that the fuses may be cut by application of laser beam energy. Fuses of polysilicon are disclosed in U.S. Pat. No. 5,241,212. However, the use of polysilicon fuses may not simplify the process of fabricating integrated circuits using multilevel metallization techniques.

A technique for forming metal fuses such as aluminum fuses is disclosed in U.S. Pat. No. 5,185,291. As disclosed therein, a first layer of aluminum material is deposited on a dielectric surface and then etched locally to form holes or windows at one or several points selected for fusing, exposing the underlying dielectric. A second layer of aluminum material is deposited and then etched to produce a desired conductive path passing through such points. Thus, laser programmable fuse links may have locally reduced thickness at those points. However, glassy surfaces of aluminum fuse links may absorb only a small amount of the impinged laser energy. This means that high energy lasers may be required to severe the fuses. Moreover, using high energy laser light may result in a large amount of the energy being reflected from uneven surfaces of the fuse links or conductive paths, such as surfaces having hillocks or spikes, and may damage an interlevel insulating layer surrounding the fuse links. Such damage may create extensive cracks reaching adjacent metal interconnects or fuse links through the interlevel insulating layer. When these interconnects or fuse links are so exposed, they may become subject to corrosion which may subsequently result in the fuse or interconnect breaking. Thus, it is desired that the fuses can be readily severed using low level laser energy.

On the other hand, it may be required that metal fuse links and interconnects be simultaneously formed on the same insulating layer in a high density integrated circuit. When the metal interconnects are disposed at narrow spacings (e.g., sub-half micron) it may be difficult to make fine etching mask patterns for forming the metal interconnects due to optical light reflection into a photoresist layer from highly reflective surfaces of the metal interconnect layer. The failure of fine etching mask patterns may cause inadvertent shorts or opens in the interconnects. Particularly, the widths of the interconnects may be smaller than desired due to the failure of fine etching mask patterns. Increased current density may also be generated by forcing the same current through the smaller interconnects which may result in increased electro-migration of aluminum atoms (i.e., metal migration) which may cause the interconnects to become opened. The fuse links may also be susceptible to increased current densities, which tend to exacerbate electro-migration defects.

Thus, notwithstanding the above described techniques, there continues to be a need for improved methods of utilizing and forming fuse links.

SUMMARY OF THE INVENTION

It is an object of the present invention to provide integrated circuits having improved metallic fuse links which may be reliably blown using laser energy and methods of forming same.

It is another object of the present invention to provide integrated circuits having metallic fuse links which may be reliably blown using low levels of laser energy and methods of forming same.

It is a further object of the present invention to provide integrated circuits having closely disposed metal interconnects and methods of forming same.

To achieve these and other objects, advantages and features of the present invention, integrated circuits are provided which include an insulating layer on a semiconductor substrate with a first and a second metal wiring layer, on the insulating layer. The first and second metal wiring layers have end surfaces (e.g., sidewalls) and upper surfaces. The first and second metal wiring layers are arranged on the insulating layer so that the end surface of the first metal wiring layer opposes the end surface of the second metal wiring layer. A metallic fuse link is also provided on a surface of the insulating layer and is located between the first and second metal wiring layers. An interlevel insulating layer is also provided on the insulating layer. The interlevel insulating layer has a groove located therein to expose the metallic fuse link and a portion of the insulating layer. A blanket protection layer is located on the metallic fuse link.

Electro-migration may be reduced by forming the metal wiring layers from aluminum. Moreover, the metallic fuse link may absorb more laser energy by creating the fuse using a material which is less reflective than aluminum. A fuse layer which absorbs more laser energy may be formed using an antireflection layer minimizing the optical light reflection from the highly reflective aluminum layer and a absorptive layer absorbing the focused laser energy. Such a layer of metal may be of TiN or TiW. The TiW layer has lower electrical resistance than that of TiN, and the optical reflection index of the TiW layer is relatively high compared to that of the TiN layer.

In one embodiment of the present invention, the reliability of a high density integrated circuit may be increased by lessening the electro-migration of aluminum in the metal wiring layers and forming a fuse which may absorb more laser energy and by reducing the optical light reflected from the metallic fuse layer to a photo resist when laser energy is impinged on the fuse. Specifically, the integrated circuit includes an integrated circuit on a semiconductor substrate and an insulating layer on the integrated circuit. A plurality of metal wiring layers on the insulating layer, connect to the integrated circuit. The metal wiring layers have end surfaces and upper surfaces connected to the integrated circuit, wherein a first and a second metal wiring layer are located so that the end surface of said first metal wiring layer opposes the end surface of the second metal wiring layer.

A metallic fuse link is located on the upper surface and on the end surface of the first metal wiring layer and on the upper surface and on the end surface of the second metal wiring layer, and on a surface of the insulating layer located between the opposing end surfaces of the first and second metal wiring layers. An interlevel insulating layer on the insulating layer and the metallic fuse link has a groove therein which exposes the metallic fuse link and a portion of the interlevel insulating layer.

The migration of aluminum may be reduced by using an aluminum alloy containing small percentages of copper(Cu) (e.g., approximately 0.5% Cu, and approximately 0.2% Si) as the material of the metal layer. However, pure aluminum or one of aluminum alloys containing small percentages of either silicon or copper may also be used.

A fuse layer which absorbs more laser energy may be formed using a metal which may serve as a barrier to the electro-migration of aluminum atoms, an antireflection layer minimizing the optical light reflection from the highly reflective aluminum layer and a absorptive layer absorbing the focused laser energy. Such a metal layer may be of TiN or TiW. The TiW layer has lower electrical resistance than that of TiN , and the optical reflection index of the TiW layer is relatively high compared to that of the TiN layer.

The optical light reflected from the metallic fuse layer to a photo resist may be reduced by using TiN to form the fuse layer. The TiN fuse layer absorbs impinged light during the patterning of the masks. Consequently, the light reflected into the photo resist from the TiN fuse layer may be reduced.

In cases where a metal wire (including a dense metal wire) and a metallic fuse link are formed on the insulating layer, it may be possible to form a metal wire on the layer of aluminum or aluminum alloy which reflect the optical beam and wherein the TiN fuse layer absorbs the optical beam. In the metallic fuse link, a thin TiN fuse layer absorbing the laser energy is heated by the low laser energy, so that the fuse layer may be fused out. Such a low laser energy can minimize stress on peripheral elements. Since the diameter of the groove formed in the interlayer insulating layer is at least larger than the diameter of the irradiated laser beam spot to expose the metallic fuse link, the interlayer insulating layer does not undergo light-induced stress. Accordingly, fissures are less likely to be generated in the interlayer insulating layer, thereby improving the reliability and the life span of the metal wires.

There is further provided a process of forming a semiconductor substrate and an insulating layer. A plurality of metal interconnections are then formed on the insulating layer, wherein at least one of the metal interconnections includes a metallic fuse link capable of being severed or blown by laser energy. Specifically the process may include the steps of forming a metal interconnection layer on the insulating layer; etching a selected portion of the metal interconnection layer to provide the metallic fuse link, forming a fuse layer of either TiN or TiW on the metal interconnection layer and the etched portion.

DETAILED DESCRIPTION OF THE PREFERRED EMBODIMENTS

Figure 1:
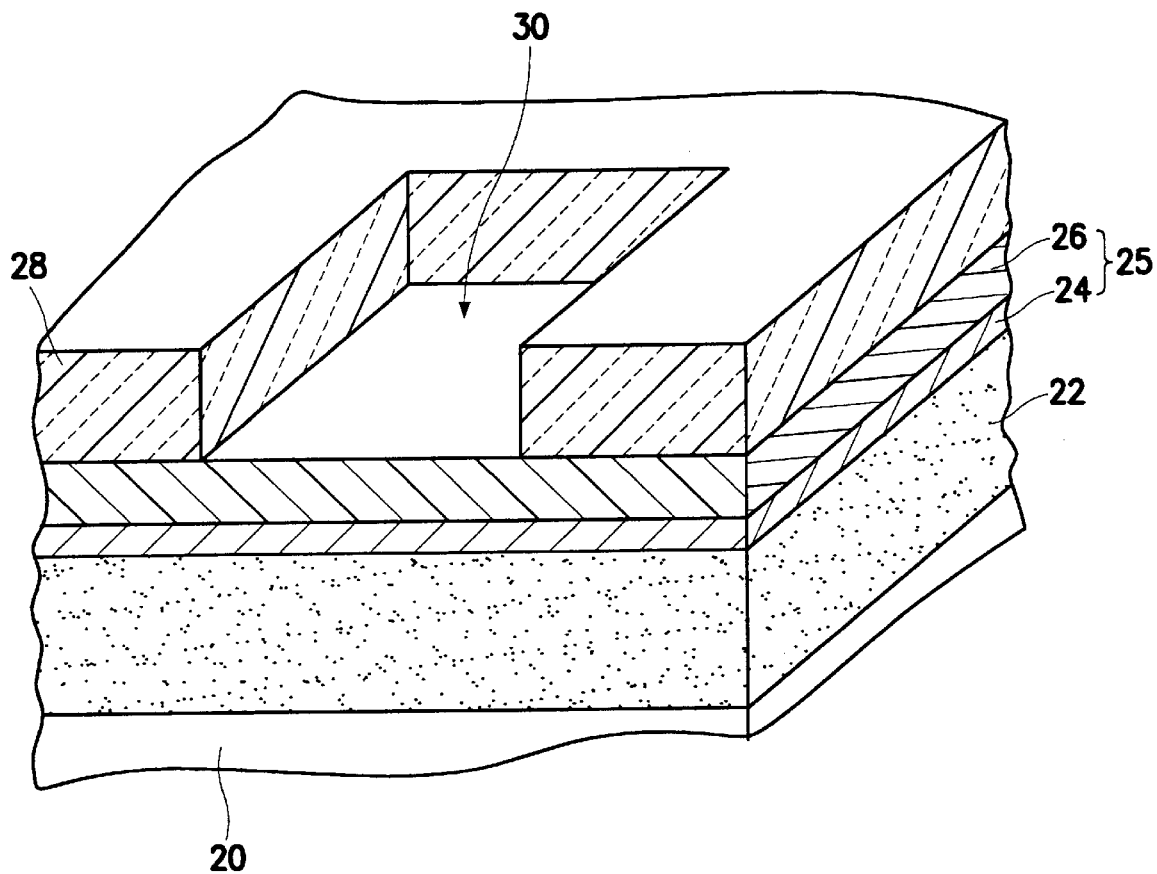
FIGS. 1 to 6 are greatly enlarged perspective cross-sectional views of intermediate structures which illustrate methods of forming fuse metallic links in accordance with one embodiment of the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 7:
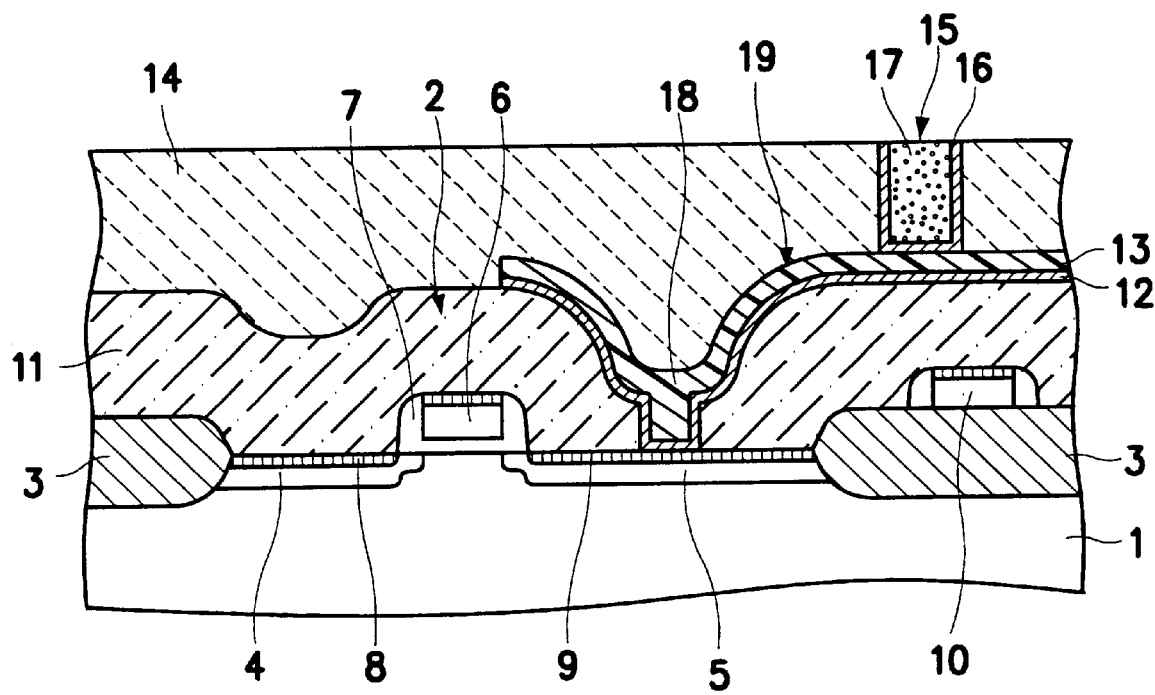
FIG. 7 is a greatly enlarged cross-sectional view illustrating the insulating layer with the metal interconnect and plug connected to the active element formed on the semiconductor substrate in accordance with one embodiment of the present invention.

Referring to FIG. 1, there is illustrated an insulating layer 22 of dielectric covering one face of a substrate 20, which may be monocrystalline silicon or other appropriate material. The substrate 20 may include appropriately doped well regions used to enable the formation of CMOS or BICMOS devices. On the appropriately doped substrate 20 is formed an integrated circuit portion including active elements such as field effect transistors, bipolar transistors or combinations thereof. Metal interconnects may be formed on the insulating layer 22 so as to be connected with the integrated circuit portion as will be described hereinafter. The insulating layer 22 may include multilevel metal interconnects comprising a plurality of interlevel insulating layers, metal interconnects formed on each interlevel insulating layer, and metal plugs formed in the interlevel insulating layers in order to couple upper and lower metal interconnects on each interlevel insulating layer. As one example, a portion of the insulating layer is illustrated in FIG. 7, in which a two-level metal interconnect is formed on the substrate having active elements.

FIG. 1 illustrates a metal interconnection layer 25 comprised of a barrier metal layer 24 and an interconnection metal layer 26 which are stacked on the insulating layer 22. If needed, a single interconnection metal layer 26 may be used as the metal interconnection layer 25. The barrier metal layer 24 may be TiW or TiN, however, TiN is preferable. In the present embodiment, the TiN barrier metal layer 24 is deposited to a thickness between about 600 Å and 1200 Å by reactive sputtering from a titanium target at a substrate temperature of about 100° C. and in an atmosphere containing argon gas with a flow rate of about 25 SCCM and nitrogen gas with a flow rate of about 105 SCCM. The atmosphere is also maintained at a pressure in a range between $10^{-8}$ Torr and $10^{-9}$ Torr prior to glow discharge and at about 4 milliTorr during glow discharge. The barrier metal layer 24 may be a bilayer of Ti and TiN. In this case, a Ti metal layer is deposited to a thickness in the range between about 200 Å and 400 Å from a Ti target in an atmosphere of argon gas by sputtering, and then the TiN layer is in situ deposited to a thickness in the range between about 500 Å and 700 Å in the same manner as described above.

The Ti layer serves to lower the electrical contact resistance to an underlying plug containing a metal such as tungsten or aluminum. After the deposition of the barrier metal layer 24, blanket interconnection metal layer 26 is deposited on the barrier metal layer 24. In a preferred embodiment of the present invention, the material of the interconnection metal layer 26 is an aluminum alloy containing small percentages of copper(Cu), for example, approximately 0.5% Cu, and approximately 0.2% Si, so as to inhibit electro-migration of aluminum. However, pure aluminum or an aluminum alloy containing small percentages of either silicon or copper may be used. In a preferred embodiment of the present invention, the interconnection metal layer 26 is successively deposited to a thickness between approximately 1 μm to 1.5 μm (without breaking vacuum) in the same chamber after the deposition of the barrier metal layer 24. After the deposition of the interconnection metal layer 26, a photoresist is covered thereon and then an etching window 30 is formed in the photoresist layer 28 which exposes the surface of the underlying interconnection metal layer 26.

Figure 2:
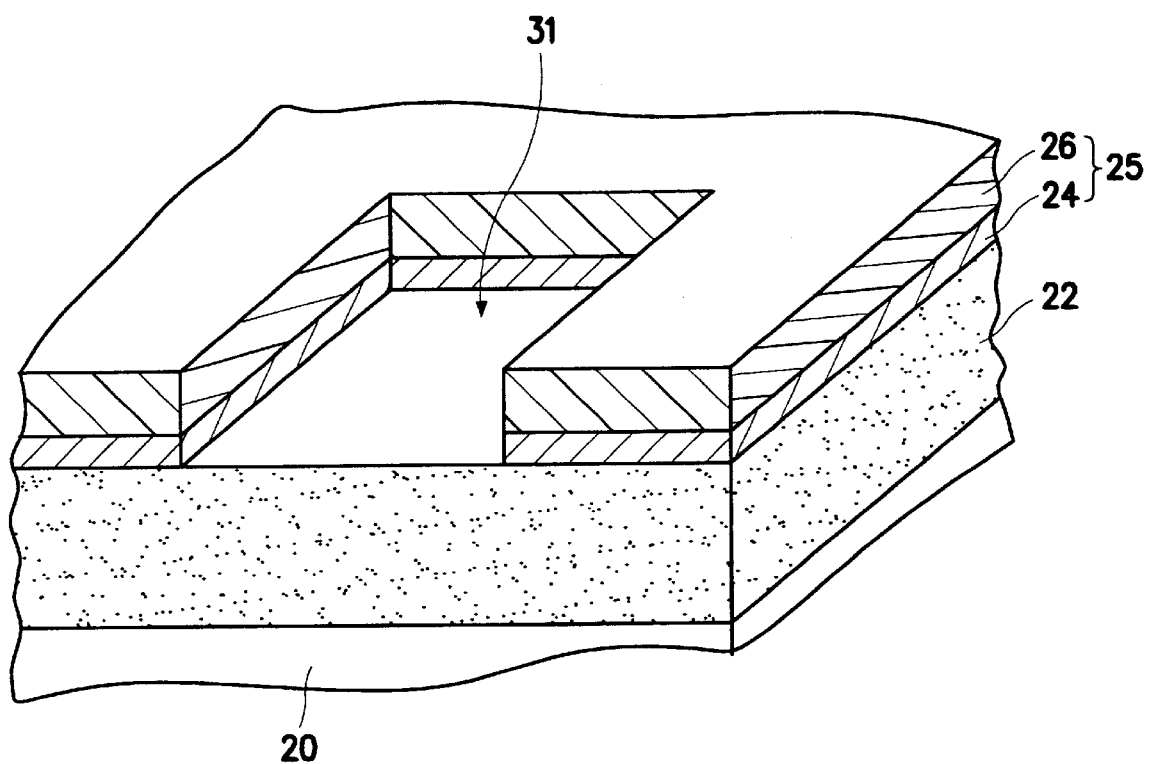

The exposed metal layer and its underlying barrier metal layer are isotropically or anisotropically etched through the etching window 30 so as to expose the surface of the underlying insulating layer 22 by a known reactive ion etching (RIE) technique, using the photoresist layer 28 as a mask. For example, the anisotropic etching of the aluminum alloy may be performed by using a mixing gas of halide and a halogen such as boron trichloride and chlorine, while the isotropical or tapered etching thereof may be accomplished by a mixing gas of CHF3 and Cl$_2$. The TiN layer 24 may be etched by a CHF$_3$—O$_2$ mixing gas. After etching through the etching window 30, the photoresist layer 28 may be removed. The resulting structure after anisotropic etching is illustrated in FIG. 2. As illustrated in FIG. 2, it should be noted that a groove 31 passing through the metal interconnection layer 25 is formed at a position where the fuse is to be formed. The area of the groove 31 may be approximately 7.2×7.2 μm$^2$.

Figure 3:
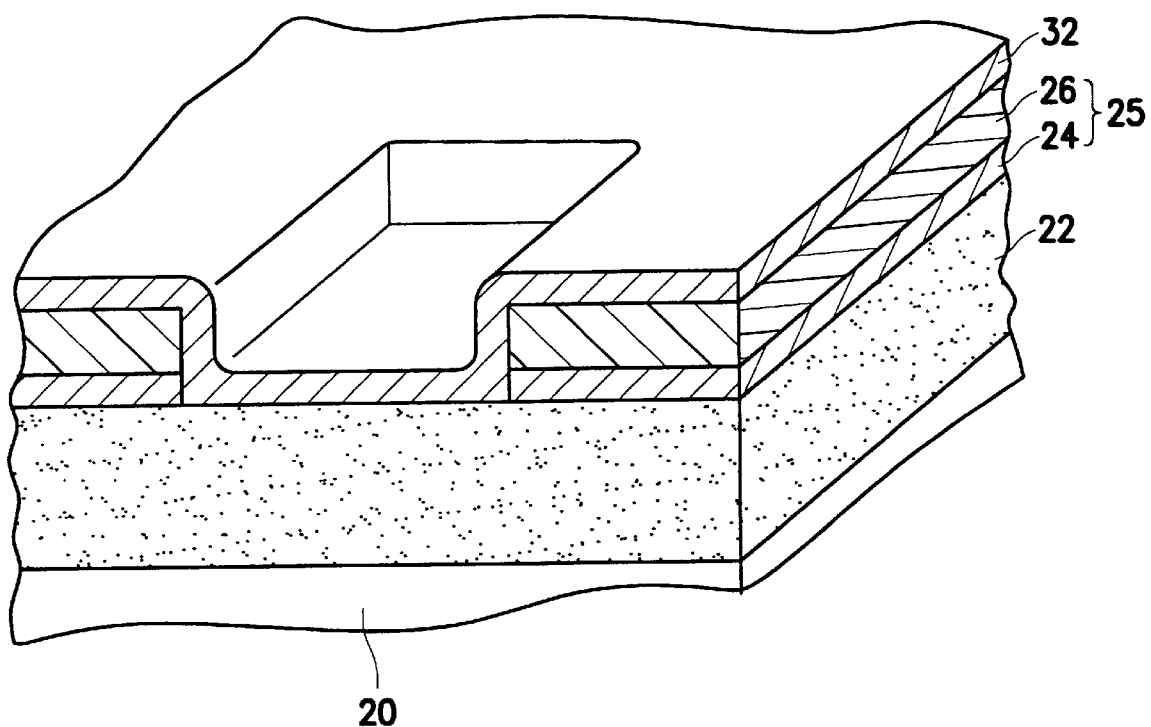

Referring to FIG. 3, a fuse layer 32 is sputter deposited on surfaces of the metal interconnection layer 25 and its sidewalls and the exposed insulating layer 22. According to the present invention, the fuse layer 32 may be made up of metal serving as a barrier layer which may inhibit the electro-migration of aluminum atoms, an antireflection layer which may reduce the optical light reflection from the highly reflective aluminum layer and an absorptive layer which may absorb the focused laser energy. Such a layer of metal may be of TiN or TiW. The TiW layer has lower electrical resistance than the TiN layer and the optical reflective index of a TiW layer may be relatively high compared to a TiN layer. In the present embodiment, a TiN layer is employed as the fuse layer 32, it should be understood, however, that TiW may alternately be used as the fuse layer 32.

The TiN fuse layer 32 is deposited to a thickness between 250 Å and 500 Å. A continuous TiN layer may be adhesively deposited on the sidewalls of interconnection metal layer 26 and barrier metal layer 24. The deposition of a preferably continuous TiN layer may be accomplished by an isotropic or tapered etching step. Prior to the deposition of the fuse layer 32, it may be important to clean and remove a native oxide film from the aluminum surface to enhance the adhesion of TiN to the interconnection metal layer 26. Such cleaning and removal may be performed by back-sputtering or reactive ion sputtering prior to the sputtering of TiN.

Figure 4:
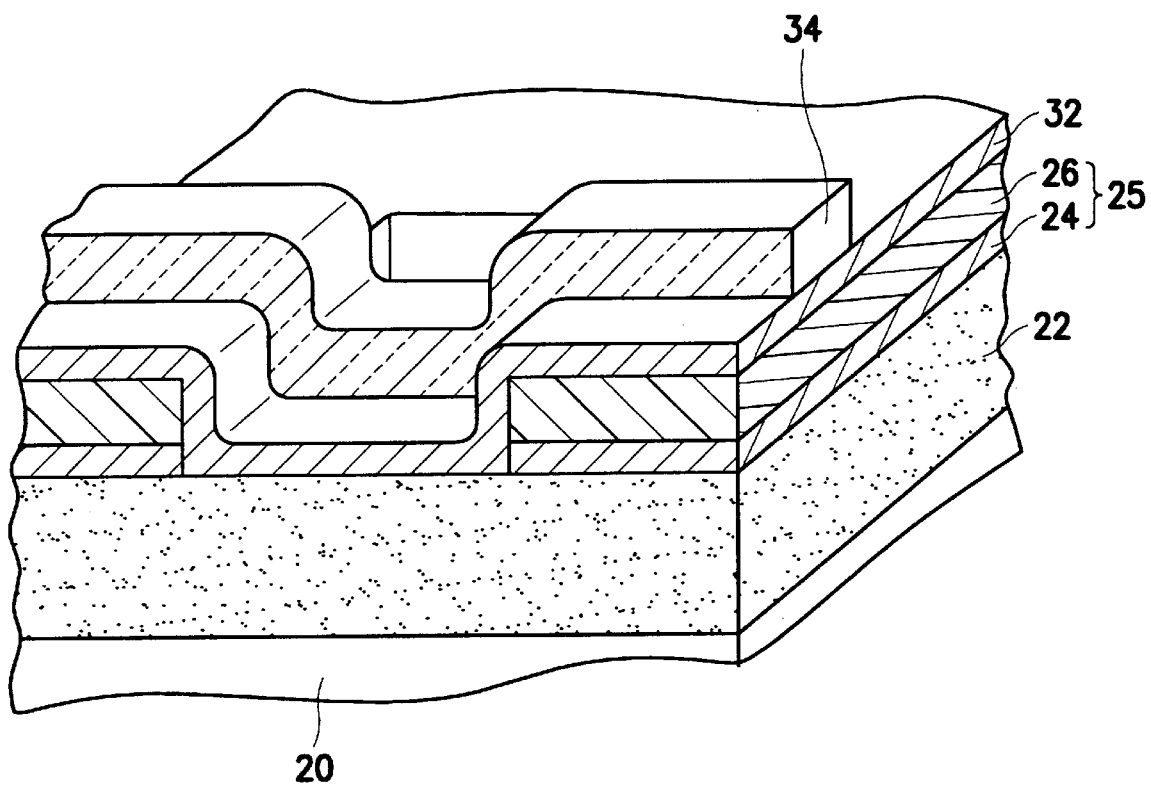

A mask layer 34 of photoresist may be formed on the fuse layer 32 by a conventional photolithography process as shown in FIG. 4. The width of the mask layer 34 may be approximately 2.5 μm. The width of the mask layer 34 is narrower than that of the groove 31 to form a metallic fuse link which is not influenced by a misalignment of the mask layer 34. The fuse layer 32, interconnection metal layer 26 and barrier metal layer 24 are anisotropically etched in turn, using the mask layer 34 as an etching mask. The mask layer 34 is then removed.

Figure 5:
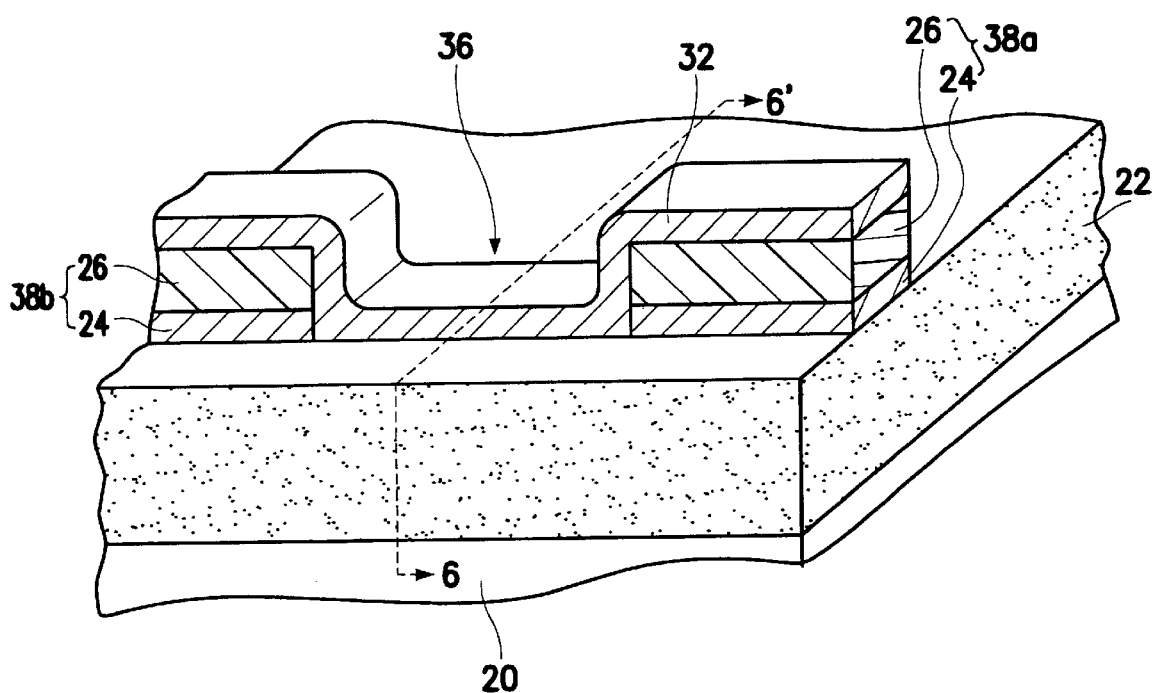

As shown in FIG. 5, the metallic fuse link 36 is defined as a fuse layer 32 connecting two spaced metal wiring layers 38a and 38b each made of the metal interconnection layer 25. The deposition of the TiN fuse layer 32 may have good adhesion onto the upper surfaces of the metal wiring layers 38a and 38b, sidewall surfaces of opposing ends of the layers 38a and 38b, and the exposed area of insulating layer 22 therebetween. Thus, the TiN layers 24 and 32 covering upper and lower surfaces and end surfaces of the aluminum layer 26 may prevent the electro-migration of aluminum which may accompany large current densities. The thinner TiN fuse layer at the fuse portion (or metallic fuse link) 36 may be readily blown by the application of a low energy laser.

In one embodiment, a metallic fuse link is formed by forming a first conductive layer (26 and 24) of first material on a substrate (22) and forming a first masking layer (28) having a first opening (30) therein, on the first conductive layer (26 and 24). The first conductive layer (26 and 24) is then etched to define a second opening (31) therein which exposes a first portion of the substrate (22) and sidewalls of the first conductive layer (26 and 24), using the first masking layer (28) as an etching mask.

A second conductive layer (32) is formed of second material in the second opening (31) and in contact with the sidewalls of the first conductive layer (26 and 24) and a second masking layer (34) is formed on the second conductive layer (32), at a location extending opposite the first portion of the substrate (22). The first and second conductive layers are etched to expose the substrate (22) and define first and second conductive segments (38a and 38b) of the first material which are electrically connected by a metallic fuse link (36) of the second material, using the second masking layer (34) as an etching mask.

Figure 6:
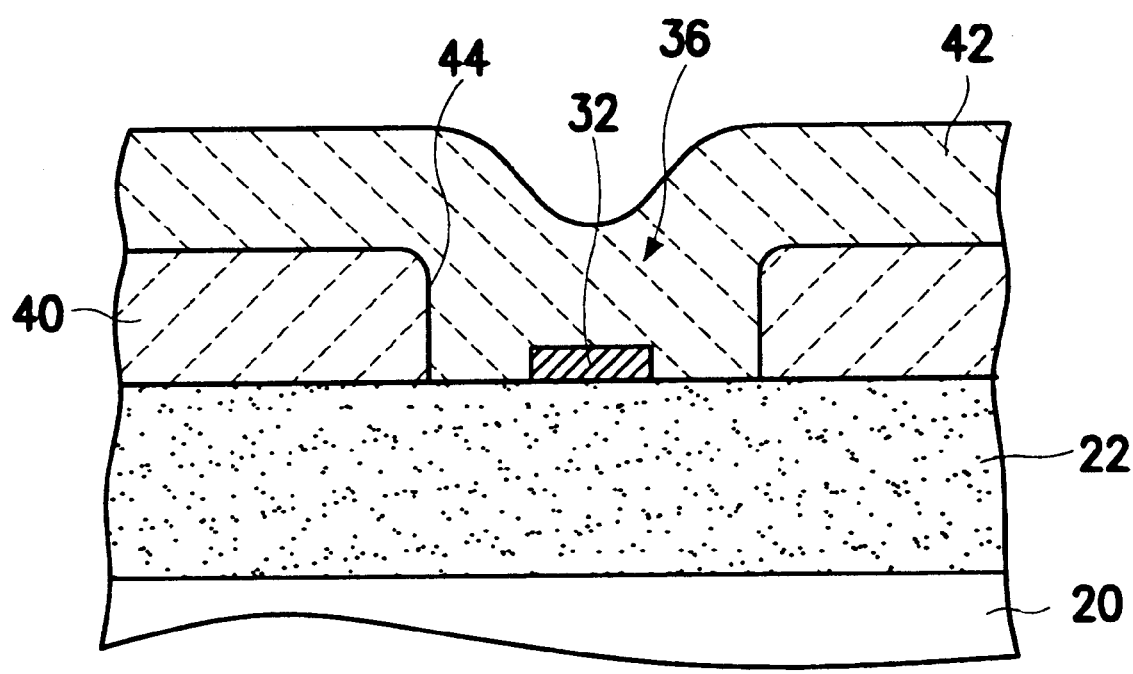

After the formation of the metallic fuse link 36, a blanket interlevel insulating layer of doped $SiO_2$ such as TEOS or Phosphosilicate glass may be deposited to a thickness of approximately 4,000 Å by a conventional CVD technique. A plug filled with aluminum or tungsten, as described above, may be formed in the interlevel insulating layer so as to connect to one of the underlying metal wiring layer 38a and 38b. An interconnection layer made in contact with the plug is formed on the interlevel insulating layer to be connected with a ground or power supply bonding pad. FIG. 6 illustrates a cross sectional view of a complete structure along a line which is perpendicular to the metallic fuse link 36. The interlevel insulating layer 40 is locally etched to produce a groove 44 exposing a portion of the metallic fuse link 36 by a conventional photolithography technique. The diameter of the groove 44 is preferably greater than the diameter of the laser beam spot used to sever the metallic fuse link 36. In the present embodiment, the groove 44 has an area of about 7×7 $\mu m^2$. After the formation of the groove 44, a blanket protection layer 42 such as a silicon nitride layer may be deposited to a thickness of approximately 6,000 Å. The protection layer on the bonding pad may be etched to expose the bonding pad.

After completion of the manufacturing processes, function tests may be performed. Assuming that the metallic fuse link 36 is to be severed by the result of the tests or the selection of a desired function, an adjusted laser beam energy irradiates the metallic fuse link 36 in such a manner that the laser beam spot having a diameter of 5 to 6 $\mu m$, is focused on the metallic fuse link 36. The laser beam energy is absorbed by the fuse layer 32, allowing the fuse layer to be vaporized. As the fuse layer 32 is vaporized, the metallic fuse link 36 is cut. The vaporization of the fuse layer 32 may generate debris (e.g., TiN particles) around the fuse layer 32. The blanket protection layer 42 may prevent the metal debris from interfering with the adjacent interconnected layers and may prevent the absorption of moisture into the interlevel insulating layer 40.

Referring to FIG. 7, there is illustrated an n-channel field effect transistor 2 isolated by field oxide regions 3 on a p-type well region 1. A gate electrode 6 of polycide is formed over a channel region between source and drain regions 4 and 5 which are contiguous to the field oxide regions 3. Refractory metal silicide layers 8 and 9, for example, titanium silicide $TiSi_2$ layers, are formed on source and drain regions 4 and 5 between both sidewalls 7 of the gate electrode 6 and field oxide regions 3 by a conventional silicide processing technique. An electrode layer 10 of polysilicide is formed on the field oxide region 3

A first interlevel insulating layer 11, such as a tetraethylorthosilicate (TEOS) oxide film, covers the active elements, field oxide regions 3 and the electrode layer 10. A via hole 18 passing through the first interlevel insulating 11 is formed, exposing the $TiSi_2$ layer 9. Titanium nitride (TiN) and aluminum (Al) are stacked in turn on surfaces of the first interlevel insulating layer 11 and on sidewalls and the bottom of the via hole 18 by way of sputtering and a metal interconnection layer 19 is then patterned by a photolithography process. The TiN layer 12 serves as a barrier metal layer that may prevent the transport of overlying aluminum to the silicide layer 9.

A second interlevel insulating layer 14 of spin-on glass (SOG) is formed on the metal-interconnection layer 19 and the exposed interlevel insulating layer 11 for its planarization. Alternately, TEOS oxide layer or CVD $SiO_2$ layer may be used instead of the SOG layer and its planarization may be accomplished by a chemical mechanical polishing (CMP) process. After the formation of a via hole for coupling to the Al layer 13, a plug made of a TiN layer 16 on the sidewalls and the bottom of via hole and a filled layer 17 of aluminum or tungsten (W) thereon may be formed by conventional sputtering or CVD and etch-back processes. Tungsten is preferably used as plug filling material for minimization of electro-migration.

The multilevel metallization scheme may be accomplished by repetitively stacking layers comprised of the interlevel insulating layer 14, plug 15 and metal interconnection layers 19 in such a manner that the metal interconnection layers are in contact with corresponding plugs. Even though simplified substrate 20 and insulating layer 20 are illustrated in the drawings, it will be understood that the insulating layer 22 may be used in the multilevel metallization process.

Fuses and a plurality of metal interconnects may be simultaneously formed on the insulating layer 22. It should be understood that the metal interconnects may be connected to the integrated circuit portion on the substrate 20 through via holes (not shown) formed in the insulating layer 22.

Figure 8:
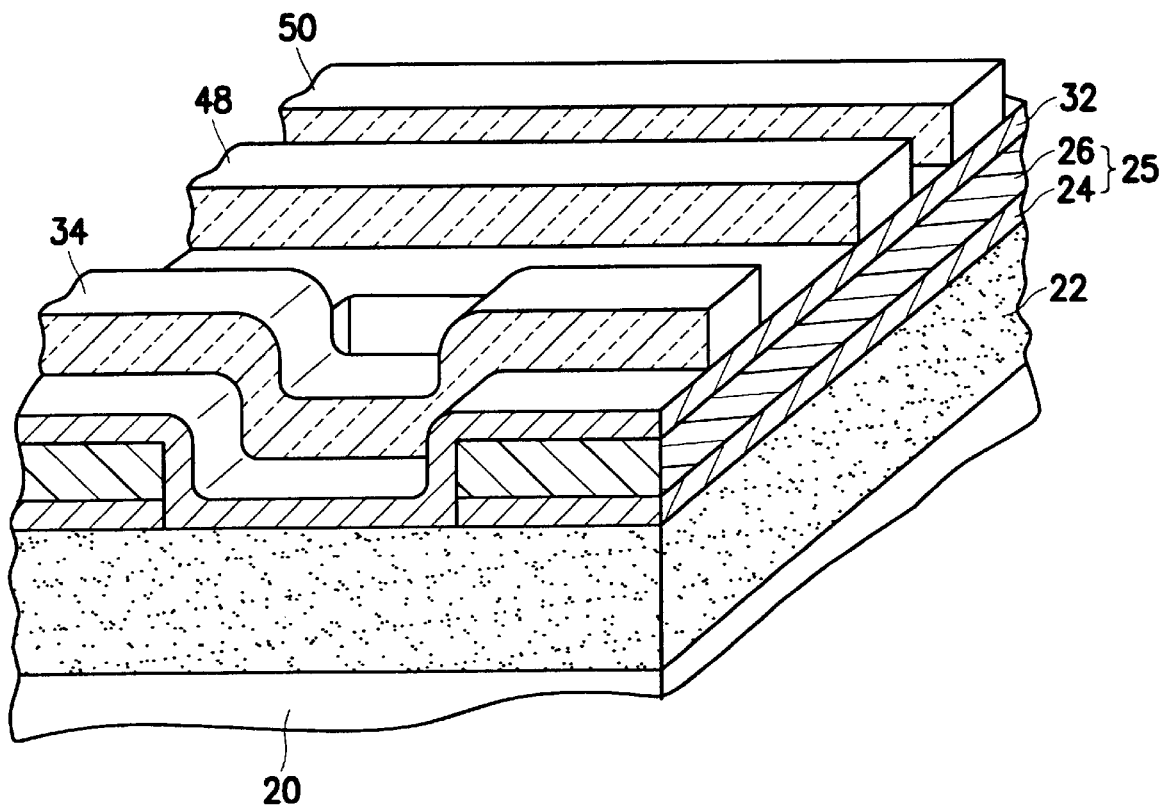
FIG. 8 is a greatly enlarged perspective view of an intermediate structure which illustrates a processing step for forming a metallic fuse link and a plurality of metal interconnects, in accordance with another embodiment of the present invention.

As shown in FIG. 8, the formation of metal interconnects and metallic fuse links may be accomplished by patterning a photoresist mask 34, 48 and 50 on the TiN fuse layer 32 after the process of FIG. 3 and then anisotropically etching. Even though the metal interconnects are narrowly spaced, the TiN fuse layer 32 absorbs light during the patterning of the masks 48 and 50. Light reflection from the TiN fuse layer 32 into the photoresist may thereby be reduced. Thus, the formation of fine metal interconnects 46 may be allowed.

Figure 9:
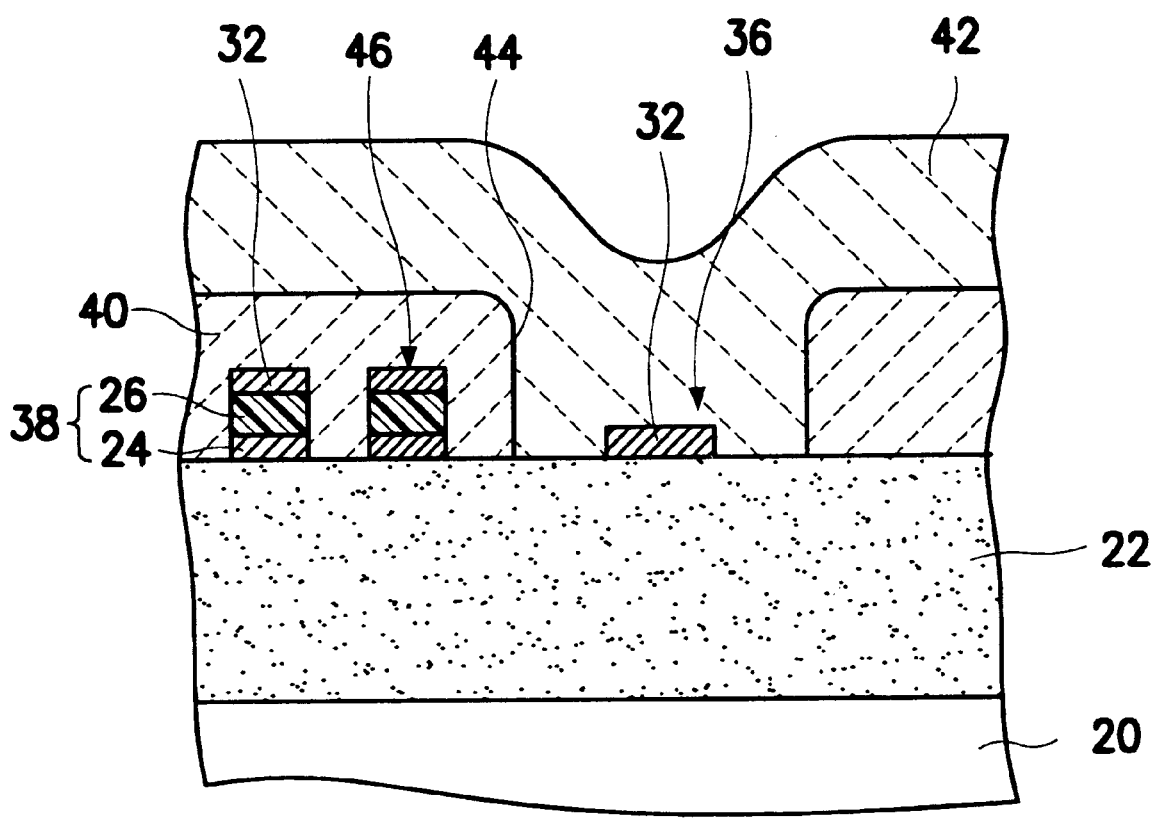
FIG. 9 is a cross-sectional view of the finished structure taken along a line perpendicular to the direction of the length of the metallic fuse link of FIG. 8.

Referring to FIG. 9, a plurality of metal interconnects, each of which may include the metal wiring layer 38 and the overlying fuse layer 32, and the metallic fuse link 36 of the TiN fuse layer 32 is formed on the insulating layer 22. Each metal wiring layer 38 may include the barrier metal layer 24 and the overlying interconnection metal layer 26 as described above.

After the formation of the metal interconnects 46 and metallic fuse link 36, as described in connection with FIG. 6, an interlevel insulating layer 40 may be formed, followed by the formation of a groove 44 to allow the connection of via holes to the metal interconnects 46 and the irradiation with a laser beam. The via holes may be filled with Tungsten to form plugs as described above. Wire bonding pads (not shown) and top-most level metal interconnects (not shown) connecting the bonding pads to the underlying metal interconnects 46 through the tungsten plugs are formed on the interlevel insulating layer 40. As shown in FIG. 9, a blanket protection layer 42 of $Si_3N_4$ is deposited and the protection layer overlying the pads is etched to expose the pads.

It is desirable that the diameter of the groove 44 be greater than that of the laser beam so that the layer does not irradiate the interlevel insulating layer. Thus, the stress on the interlevel insulating layer 40 may be reduced. If such a stress were placed on the interlevel insulating layer 40, the blanket protection layer 42 and interlevel insulating layer 40 nearby the metallic fuse link 36 may develop cracks. If the cracks were to reach the metal interconnect 46 adjacent to the severed metallic fuse link 36, moisture may cause the metal interconnect 46 to be corroded over time, thereby gradually deteriorating the electrical resistance of the metal interconnect 46. Such corrosion may result in an open interconnect. Thus, since the interlevel insulating layer 40 may not take the stress described above, the reliability of metal interconnects may be enhanced.

As can be understood from the foregoing descriptions, the metallic fuse link may be composed of a TiN fuse layer formed on opposing end surfaces of two metal conductive layers of aluminum or aluminum alloy. An insulating layer between the opposing end surfaces may reduce the movement of electrons of aluminum atoms and the implantation of the aluminum. This may result in an improvement in the reliability of the metal wire layer and the metallic fuse link.

In cases where a metal wire (including a dense metal wire) and a metallic fuse link are formed on the insulating layer, it may be possible to form a metal wire on the layer of aluminum or aluminum alloy which reflect the optical beam and wherein the TiN fuse layer absorbs the optical beam. The thin TiN fuse link absorbs the laser energy and is heated, so that the metallic fuse link may be severed. Such a low laser energy can minimize stress on peripheral elements. Since the diameter of the groove formed in the interlayer insulating layer is larger than the diameter of the irradiated laser beam spot, the interlayer insulating layer may be subjected to reduced stress, thereby reducing the likelihood of a crack developing in the metal interconnection layer and allowing an increase in the reliability and the life span of the metal interconnect.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit comprising:

a semiconductor substrate;

an insulating layer on said semiconductor substrate;

a first metal wiring layer having an end surface and an upper surface on said insulating layer;

a second metal wiring layer having an end surface and an upper surface on said insulating layer, wherein said first and said second metal wiring layers are arranged so that the end surface of said first metal wiring layer opposes the end surface of said second metal wiring layer;

a metallic fuse link on the upper surface and the end surface of said first metal wiring layer and on the upper surface and the end surface of said second metal wiring layer, and on a surface of said insulating layer located between said first and second metal wiring layers;

an interlevel insulating layer directly on and in contact with said insulating layer, said interlevel insulating layer having a groove therein which exposes said metallic fuse link and a portion of said insulating layer extending adjacent said metallic fuse link; and a blanket protection layer on said metallic fuse link.

2. The integrated circuit of claim 1, wherein said metallic fuse link comprises TiN or TiW.

3. The integrated circuit of claim 2, wherein said first and second metal wiring layers comprise a layer of pure aluminum or aluminum alloy.

4. The integrated circuit of claim 2, wherein said first and second metal wiring layers comprise a barrier metal layer, and an aluminum or aluminum alloy layer on the barrier metal layer.

5. The integrated circuit of claim 2, wherein said groove has an area larger than an area covered by a laser beam used to sever said metallic fuse link.

6. The integrated circuit of claim 4, wherein said barrier metal layer comprises a TiN layer.

7. An integrated circuit comprising:

an integrated circuit on a semiconductor substrate;

an insulating layer on said integrated circuit;

a plurality of metal wiring layers on said insulating layer that connect to said integrated circuit, said plurality of metal wiring layers having end surfaces and upper surfaces, wherein a first and a second metal wiring layer in the plurality thereof are located so that the end surface of said first metal wiring layer opposes the end surface of said second metal wiring layer;

a metallic fuse link on the upper surface and the end surface of said first metal wiring layer and on the upper surface and the end surface of said second metal wiring layer, and on a surface of said insulating layer located between the opposing end surfaces of said first and second metal wiring layers; and an interlevel insulating layer directly on and in contact with said insulating layer and said metallic fuse link, said interlevel insulating layer having a groove therein which exposes the metallic fuse link and a portion of said interlevel insulating layer extending adjacent said metallic fuse link.

8. The integrated circuit of claim 7, wherein said metallic fuse link comprises a TiN or TiW layer.

9. The integrated circuit of claim 8, wherein said first metal wiring layer and said second metal wiring layer comprise a barrier metal layer and a metal interconnection layer on said barrier metal layer.

10. The integrated circuit of claim 9, wherein said barrier metal layer comprises a TiN layer and said metal interconnection layer comprises an aluminum or aluminum alloy layer.

11. The integrated circuit of claim 7, wherein said groove has an area larger than an area covered by a laser beam used to sever the metallic fuse link.

12. The integrated circuit of claim 11, further comprising a plurality of upper metal interconnections, on said interlevel insulating layer, that connect to said metallic fuse link; and a blanket protection layer on said exposed metallic fuse link and said upper metal interconnections.

* * * * *